United States Patent [19]

Koo et al.

[11] Patent Number: 5,421,973
[45] Date of Patent: Jun. 6, 1995

[54] REACTIVE SPUTTER DEPOSITION OF LEAD CHEVREL PHASE THIN FILMS

[75] Inventors: Kwan F. Koo; Irmgard M. Schewe-Miller; Glenn L. Schrader, all of Ames, Iowa

[73] Assignee: Iowa State University Research Foundation, Inc., Ames, Iowa

[21] Appl. No.: 941,416

[22] Filed: Sep. 8, 1992

[51] Int. Cl.$^6$ .............................................. C23C 14/34
[52] U.S. Cl. ............................ 204/192.15; 204/192.24
[58] Field of Search ..................... 204/192.14, 192.15, 204/192.18, 192.22, 192.24

[56] References Cited

U.S. PATENT DOCUMENTS 4,731,172  3/1988  Adachi et al. .............. 204/192.15 X
4,952,295  8/1990  Kawabata et al. ............. 204/192.15

OTHER PUBLICATIONS

O. P. Bahl. E. L. Evens, and J. M. Thomas, *Proc. Roy. Soc.*, London Ser. A. 306, 53, (1968).
O. Weiser, and S. Landa, *Sulphide Catalysts, Their Properties and Applications*, Pergamon, Oxford, 1973.
C. K. Banks, L. Kammerdiner, and H. L. Luo. *J. Solid State Chem.* 15, 271 (1975).
P. Przyslupski, R. Koryn, and J. Szymaszek, *Solid State Chem.* 28, 869 (1978).
P. Przyslupski, in: *Ternary Superconductors*, (Shency, Dunlop, Fradin, eds.), p. 125, Elsevier, North Holland, 1981.
H. Adrian, G. Hertel, C. Nolscher, G. Saemann-Ishenko, and L. Soldner, *Physica* 107B, 647 (1981). [same as G. Hertel et al. (1981)].
J. W. Lynn, G. Shirane, W. Thomlinson, R. N. Shelton, and D. E. Moncton, *Phys. Rev. B.* 24(7), 3817 (1981).
R. Chevrel, and M. Sergent, in: *Topics in Current Physics*, (O. Fisher and M. B. Maple, eds.), vol. 32, p. 25, Springer-Verlag, Berlin, 1982.
H. Topsoe, and B. S. Clausen, *Catal. Rev.-Sci. Eng.* 26 (384), 395 (1984).
J. M. Tarascon, F. J. Disalvo, D. W. Murphy, G. W. Hull, E. A. Rietman, and J. V. Waszczak, *J. Sol. State Chem.*, 54, 204 (1984).
G. Hertel and T. P. Orlando, *Physica* 135B, 168 (1985).
R. J. Webb, *IEEE Trans. Magn.*, MAG-21(2), Mar., 835 (1985).
R. J. Webb and A. M. Goldman, *J. Vac. Sci. Technol.* A3(5), Sep./Oct., 1907 (1985).
G. B. Hertel, and T. P. Orlando, *J. Apl. Phys.* 61(10), 4829 (1987).
G. L. Schrader, and M. E. Ekman, in: *Advances in Hydrotreating Catalysts*, M. L. Ocelli and R. G. Anthony, eds.), vol. 50, p. 41, Elsevier, Amsterdam, 1989.
M. Rabiller-Baudry, R. Chevrel, and M. Sergent, *J. Alloys and Compounds* 178, 441 (1992).

*Primary Examiner*—Nam Nguyen
*Attorney, Agent, or Firm*—Schwegman, Lundberg & Woessner

[57] ABSTRACT

A method is provided to form a lead Chevrel phase coating of the formula $PbMo_6S_8$ on a substrate by employing the techniques of reactive sputtering comprising: (a) sputtering lead (Pb) and molybdenum (Mo) from homogeneous targets of Pb and Mo in vacuo in an atmosphere of argon and hydrogen sulfide so as to deposit a coating of $PbMo_6S_8$ on said substrate; and (b) annealing said $PbMo_6S_8$ coating at a pressure at which Pb is not lost from the coating; wherein the targets and the substrate are contained within a vacuum chamber during steps (a) and (b).

12 Claims, 4 Drawing Sheets

REACTIVE SPUTTER DEPOSITION OF LEAD CHEVREL PHASE THIN FILMS

The United States government has certain rights in this invention pursuant to Grant No. ITA 87-02 between the U.S. Department of Commerce and Iowa State University.

BACKGROUND OF THE INVENTION

The most widely used industrial hydrodesulfurization (HDS) catalysts are derived from alumina-supported oxides of Mo (or W) and Co (or Ni) which are sulfided for use. See O. Weisser et al., *Sulphide Catalysts, Their Properties and Applications*, Pergamon Press, Oxford, U.K. (1973). HDS research has focused on the elucidation of catalyst structure and composition and the nature of the active sites. For example, see H. Topsoe et al., *Catal. Rev.-Sci. Eng.*, 26, 395 (1984). Several years ago, a new class of materials referred to as Chevrel phases or "reduced" molybdenum sulfides were identified as potential HDS catalysts. See G. L. Schrader et al., in *Advances in Hydrotreating Catalysts*, Vol. 50, M. L. Ocelli et al., eds., Elsevier, Amsterdam (1989) at page 41. Chevrel phase materials are ternary molybdenum chalcogenides of the general formula $M_xMo_6Z_8$, wherein M can be over forty different elements and Z is S, Se or Te. See R. Chevrel et al., *Topics in Current Physics*, 34, 25 (1982). Bulk Chevrel phase catalysts were shown to have comparable or higher thiophene and benzothiophene HDS activities compared to conventional catalysts (normalized to the surface area of bulk samples). In addition, Chevrel phases were shown to favor desulfurization over hydrogenation (HYD), making them potentially more selective catalysts.

Current methods for preparing highly pure bulk Chevrel phase materials rely primarily on solid state preparation techniques using stoichiometric amounts of metal sulfides in combination with either $MoS_2$ or Mo and S. Powders of these components are thoroughly ground together and heated in fused-quartz tubes at temperatures between 1000° C. and 1200° C. for periods of as long as several days (J. W. Lynn et al., *Phys. Rev. B*, 24, 3817 (1981)).

Such techniques are not easily adaptable for preparation of supported Chevrel phases. Supported catalysts are useful for industrial applications in which a high surface area support is needed for catalyst dispersion. However, it is also possible that catalytic properties may be altered by the process of binding the catalyst to the support. For HDS catalysts, different exposures of edge or corner sites may occur which would probably alter the number of active sites. See H. Topsoe et al., *Catal. Rev.-Sci. Eng.*, 26, 395 (1984); O. P. Bahl et al., *Proc. Roy. Soc. London*, Ser. A306, 53 (1968). The catalyst also may react with the support and subsequently lose activity or selectivity.

Reactive sputtering is a potentially useful method for depositing Chevrel phases on supports. Previous attempts to sputter Chevrel phases have been motivated by the superconducting properties of these materials. See P. Przyslupski, in *Ternary Superconductors*, Shency, Dunlop, Fradin, eds., Elsevier (1981) at page 125. $PbMo_6S_8$, $BaMo_6S_8$, $AgMo_6S_8$, $Sn_{1.2}Mo_{6.4}S_8$, $Cu_{3.5}Mo_6S_8$, $Ho_xMo_6S_8$, and $LaMo_6S_8$ have been produced by sputtering techniques. Three general approaches have been used to obtain stoichiometric films. First, composite targets have been used in which the target is a hard, pressed tablet, fabricated from a preselected mixture of the powders of the elements corresponding to the desired composition. Second, sintered targets of Chevrel phases have been used. Both of these approaches require post-annealing of the deposited (amorphous) material at elevated temperatures in order to form single phase films. The third sputtering technique which has been employed to produce a restricted number of non-lead Chevrel phases uses reactive sputtering of multiple targets in an $Ar/H_2S$ atmosphere; deposition occurs directly on the heated substrate. This approach eliminates the need for composite or sintered targets and also offers advantages of one-step preparation. See G. B. Hertel et al., *J. Appl. Phys.*, 61, 4829 (1987).

However, difficulties are encountered in using sputtering to deposit lead Chevrel phases. The relative concentration of three constituents has to be controlled with a very high degree of accuracy because of the narrow phase range of the lead Chevrel phase. See J. M. Tarascon et al., *J. Sol. State Chem.*, 54, 204 (1984). Moreover, Pb (m.p. 327.5° C.) and S (m.p.=115.2° C.) are both highly volatile at the temperature used for formation of the lead Chevrel phase (about 1050° C.). Therefore, only $Ag_xMo_6S_8$ and $Cu_xMo_6S_8$ films have been successfully prepared by sputtering in situ on hot substrates (850° C.). See G. Hertel et al., *J. Apl. Phys.*, 61, 4829 (1987) and P. Przyslupski et al., *Solid State Com.*, 28, 869 (1978).

In 1978, P. Przyslupski et al., in *Solid State Com.*, 28, 869 (1978) reported the successful sputter deposition of Pb Chevrel phase thin films. A pressed composite target formed from a mixture of $MoS_2$ and PbS powders was used. These materials were sputtered onto sapphire substrates at ambient temperature. Deposited films were amorphous, and annealing in sealed quartz tubes at 850° C. to 1050° C. was used to produce crystalline films of $PbMo_6S_8$.

Targets consisting of sintered lead Chevrel phases have also been used, for example, by H. Adrian et al., *Physica*, 1078, 647 (1981). Again, annealing the as-deposited films was required. These targets generally have limited versatility in varying the stoichiometry of the deposited material.

A more modular target was used by C. K. Banks et al., *J. Solid State Chem.*, 15, 271 (1975). $MoS_2$ was overlaid with wedges or sheets of PbS, and in this case, the composition of the film could be varied by changing the dimensions of the metal sulfide sheets. However, because some components of the target were not good conductors, RF-sputtering had to be employed. The variable composition of these targets can also lead to differences in the sputtering rate of each component, and this film homogeneity.

Therefore, a continuing need exists for a method to reproducibly form homogeneous coatings of a variety of lead Chevrel phases on various substrates at acceptable deposition rates.

SUMMARY OF THE INVENTION

The present invention provides a method for the formation of a lead Chevrel phase coating of the formula $PbMo_6S_8$ on a substrate by employing the techniques of reactive sputter deposition or "reactive sputtering" to sputter lead (Pb) and molybdenum (Mo) from discrete homogeneous targets of Pb and Mo in vacuo in an atmosphere of argon and hydrogen sulfide, so as to deposit an amorphous coating, such as a thin film, comprising Pb, Mo and S on the surface of a substrate which is contained within a vacuum chamber with the targets. The coating thus formed is then annealed, preferably in situ (in the vacuum chamber), in vacuo, at a pressure at which lead is not sublimated from the coating, to form a coating of crystalline $PbMo_6S_8$.

Thus, while the sputtered coating is formed at ambient temperature, e.g., at less than about 150° C., i.e., at about 25°-150° C. under high vacuum conditions, e.g., at about 2.5-50 mtorr, most preferably at about 4-10 mtorr, the coating can be annealed in the vacuum chamber in which it is formed, e.g., at about 750°-850° C., under a pressure which do not alter the stoichiometry of the $PbMo_6S_8$ coating, e.g., at about 1-2 torr (1-2 mm Hg). Preferably, the annealing step is carried out in an inert gas atmosphere, such as a nitrogen or an argon atmosphere.

Although the films can be successfully prepared in a two-step process using a discrete annealing step, this is not a preferred embodiment of the invention, due to the increased potential for contamination. Preferably, during the sputter deposition step, the argon (Ar) and hydrogen sulfide ($H_2S$) atmosphere is provided by introducing separate streams of the two gasses into the vacuum chamber at preselected flow rates, i.e., of about 5-15 sccm (standard $cm^3/min$) for $H_2S$ and about 7.5-10 sccm for argon. The targets can be sputtered conventionally, e.g., with inert gas RF or DC plasmas, using sputtering guns positioned above the substrate.

The type of substrates that can be coated with $PbMo_6S_8$ is not critical to the present method, so long as it can withstand the preferred annealing temperatures. Thus, useful substrates include alumina ($Al_2O_3$), zirconia ($ZrO_2$), sapphire, and quartz, as well as various metals including molybdenum and stainless steel. The substrate may be a shaped body, such as a wafer, or may be particulate.

The present method provides the first successful reactive sputter preparation of Chevrel phase films of the general formula $M_xMo_6Z_8$, wherein M is Pb, $x=1$ and Z is S. The present sputter deposition method reduces or eliminates problems of reproducibility, deposit homogeneity, target preparation and deposition rate control, that art workers previously encountered in sputter deposition of lead Chevrel phase thin films. The present method has greatly improved the turn-around time for each sample. By using commercially available, high purity targets and a reactive gas ($H_2S$), this process has eliminated the time-consuming preparation of composite targets and the potential for target contamination. Very homogeneous crystalline films were produced and their composition can be easily changed by varying the sputtering power of an individual target or the reactive gas flow rate. The thickness of the films can also be varied widely, e.g., from about 500Å to 5 μm. The exemplified films were about 0.1-1 μm in thickness.

DETAILED DESCRIPTION OF THE INVENTION

Figure 1:
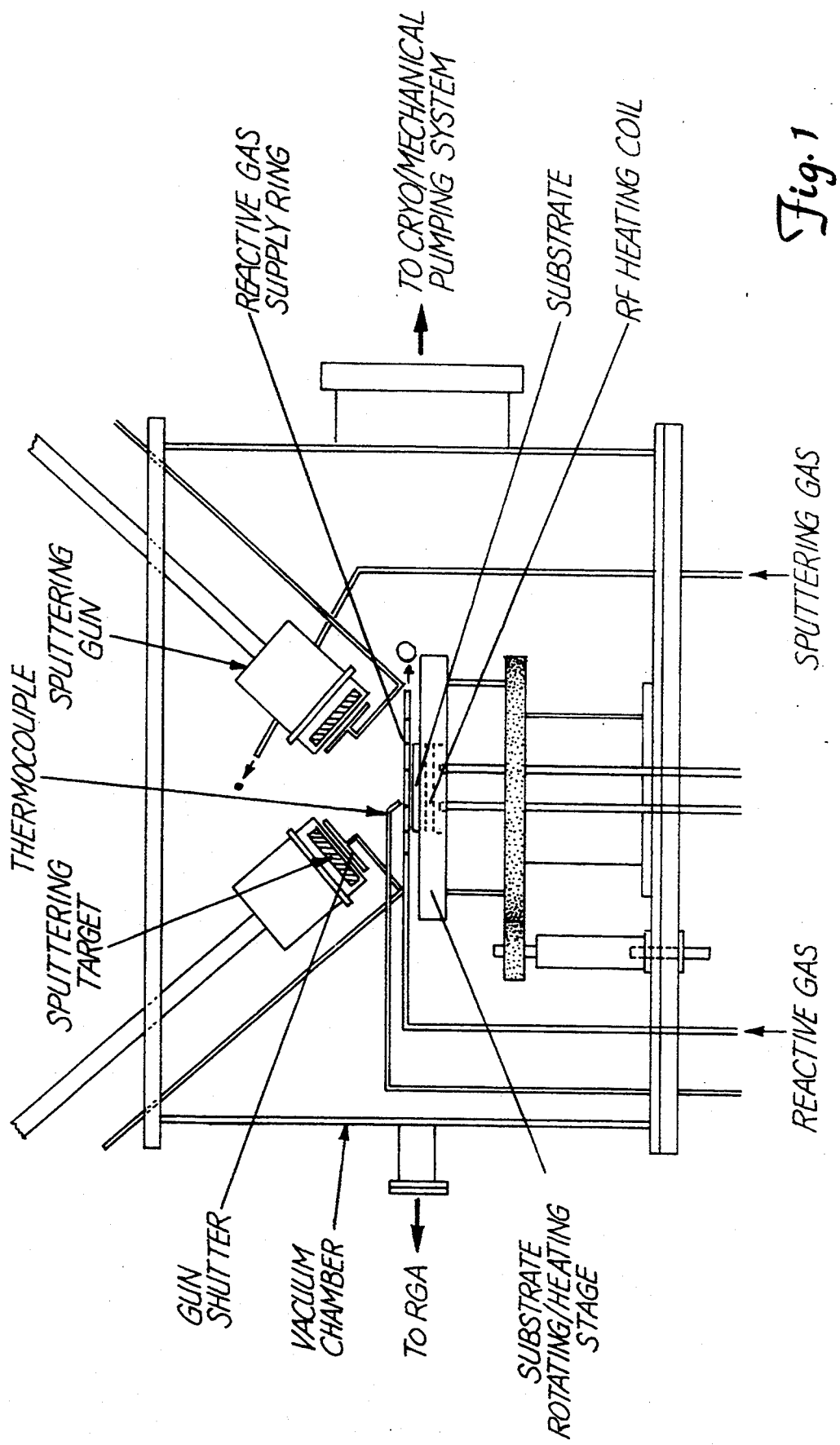
FIG. 1 is a schematic depiction of a high vacuum sputtering system useful to carry out the present method.

A preferred sputtering system to carry out the present method is schematically depicted in FIG. 1 and is similar to the cryopumped, high vacuum (HV) magnetron sputtering system which is commercially available from Plasmatron, Inc. This system is equipped with two DC and one RF power source (not shown). The RF source operates at 13.56 MHz (50 ohms output impedance) and can generate up to 500 W electrical power. The two DC sources are equipped with independent voltage and current control and can operate up to 600 V and 1.5A. Three sputtering guns (two are shown) are concentrically mounted on the top of the chamber (pneumatically operated cover plate) focusing the substrate holder. Rotatable shutters in front of each gun permit presputtering of the targets and preparation of multilayer samples.

Each gun is designed to house a 2" diameter target, and can be closed or opened via a shutter. During deposition, the target is cooled by deionized water supplied from a closed circulation system with temperature control (NESLAB Instruments, Inc.) The substrate platform is positioned in the center of the chamber (focal point of all 3 sputtering guns) and can be rotated at various speeds during deposition. The substrate can be cooled by recirculating deionized water or heated by an induction heater (Lepel Co.) positioned under the substrate holder. The induction heater power supply is 2.5 kW and can heat the substrate up to 1000° C. The substrate temperature is regulated by a potentiometer and monitored via a thermocouple through a temperature display. The stainless steel vacuum chamber is 18 inches in diameter and capable of achieving a base pressure of $10^{-8}$ torr, via a cryo/mechanical pumping system (not shown). The chamber wall can also be cooled down to 18° C. by circulating water or heated to 98° C. by external heating tapes during deposition or evacuation. An inlet tube is provided for the reactive gas ($H_2S$,→o), which is dispersed above the substrate via a reactive gas supply ring. A flow of the sputtering gas (Ar,→•) is provided via a second inlet tube.

The invention will be further described by reference to the following detailed examples.

EXAMPLE 1

PREPARATION OF $PbMo_6S_8$ FILMS

A. Sputtering and Annealing Conditions

Samples were reactively sputtered from Mo (99.95%) and Pb (99.9999%) targets (all from Superconductive Components) in an Ar (ultra pure carrier grade, Air Products) and $H_2S$ (99.998%, Air Products) atmosphere. Sintered $\alpha$-alumina plates (2"×2"–0.025" thick, McMaster-Carr Supply Co.), sapphire windows (1" dia.–0.05" thick, Swiss Jewel Co.), quartz plates (1"×1"–0.125" thick, Fisher Co.), and Mo sheets (1"×1"–0.03" thick, Fisher Co.) were used as substrates. Mo sheets were reduced in a $H_2$ flow at 1000° C. for 24 hrs to eliminate surface oxides.

The following deposition parameters were used: chamber presssure: 4 mTorr; Ar gas flow rate: 8 sccm; $H_2S$ gas flow rate: 8-15 sccm; RF-sputtering power for Mo: 120 W; DC-sputtering current for Pb: 25 mA-50 mA; substrate temperature: ambient; Post-annealing temperature: 800° C.

Prior to the deposition, all substrates were heated to 400° C. for 8 hrs in the vacuum chamber of the sputtering system under vacuum ($10^{-7}$ torr) to desorb surface moisture and volatile species. To prepare the in situ post-annealed samples, substrates were also pre-sintered at 800° C. for 4 hrs, and then allowed to cool to ambient temperature before deposition. The deposited films were either annealed in an evacuated quartz tube at $10^{-4}$ torr or in the back-pressurized sputtering chamber at 1.5 torr. Annealing was performed at 800° C. for 4 hrs.

B. Characterization of Films

The bulk crystallinity and purity of the $PbMo_6S_8$ thin films were determined by X-ray diffraction (XRD). XRD patterns were acquired with a Siemens D500 diffractometer using $CuK_\alpha$ radiation. A flat sample holder was used and the diffraction patterns were recorded in 2 q range from 12° to 55°.

Laser Raman spectra (LRS) were recorded using a Spex 1877 Triplemate monochromator, a Spex 164 Argon ion laser operating at 514.4 nm and 200 mW measured at the source, and an EG&G OMAII data acquisition system. This technique was used to confirm the presence or absence of amorphous $MoS_2$ in the samples.

Scanning electron micrographs (SEM) were obtained on a JEOL JSM-840A scanning microscope to show microstructures of thin film/support and to determine the thickness of deposits.

Energy dispersive X-ray spectroscopy (EDS) was used to determine the elemental composition (Kevex Delta V microanalyzer system). Spectra were acquired using 7.0 key accelerating voltage, incident angle 90.0°, emergence angle 40.0°, at energy range of 0.610 to 3.340 keV.

C. Two-Step Process

Single phase $PbMo_6S_8$ films were first obtained on $\alpha$-$Al_2O_3$ substrates by a two-step process. First, reactive sputtering of Mo and Pb in an $ArH_2S$ atmosphere at ambient temperature (<150° C.) was used to produce amorphous films containing Pb, S, and Mo. After removal of the coated substrates from the chamber and subsequent annealing at elevated temperatures in evacuated quartz tubes, crystalline films of $PbMo_6S_8$ were formed on the alumina substrates.

Figure 2:
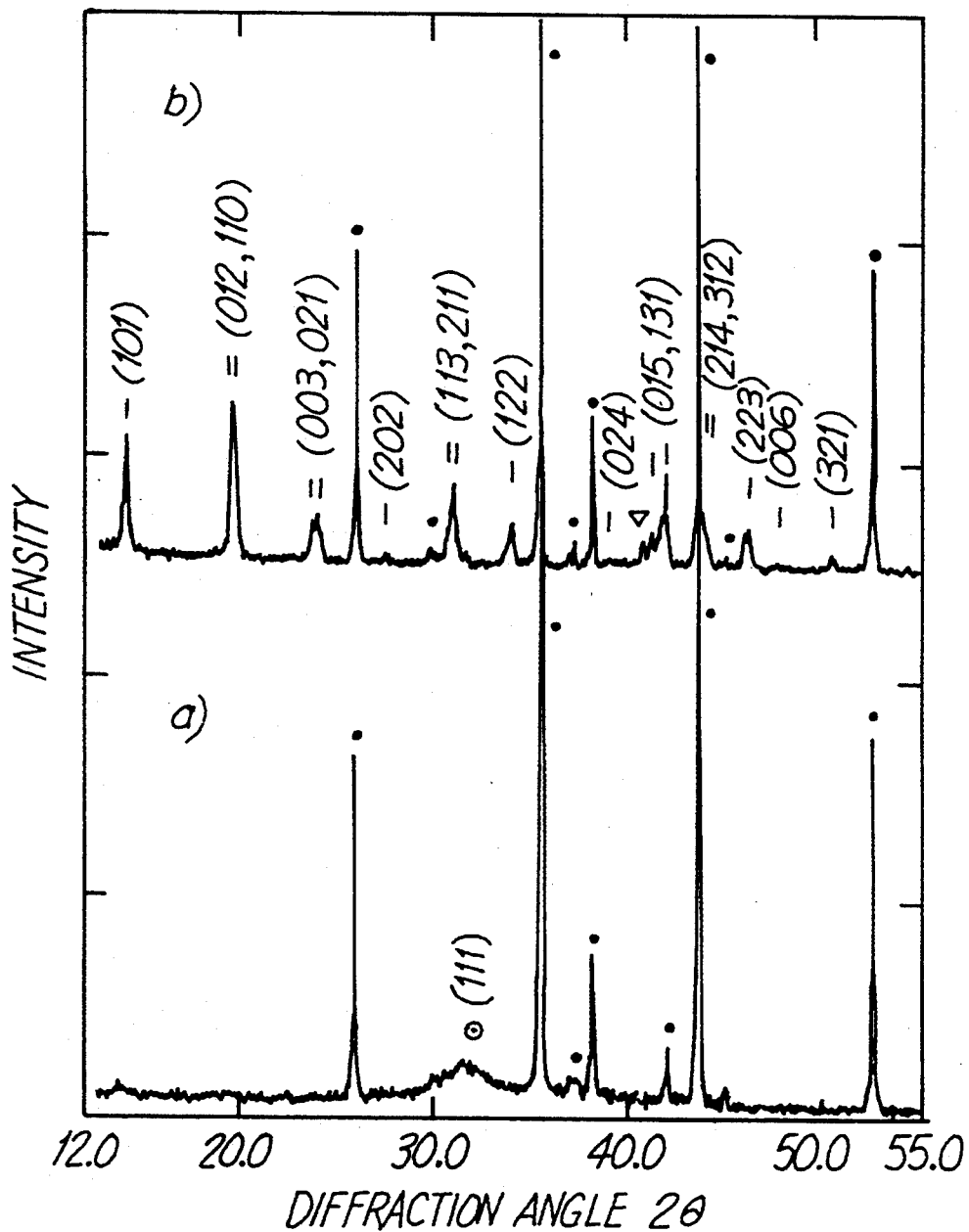
FIG. 2 depicts the XRD patterns of a $\alpha$-$Al_2O_3$ plate-supported sample a) before and b) after annealing (the $PBMo_6S_8$ reflections are indexed based on the hexagonal unit cell).

The deposited films were predominantly amorphous, and only exhibited a small amount of Pb metal as determined from XRD patterns. Peaks of $\alpha$-$Al_2O_3$ were also observed. The crystalline $PbMo_6S_8$ films which resulted from annealing were randomly oriented with respect to the support surface (FIG. 2). No secondary crystalline phases ($MoS_2$, d=6.12A) were observed, except for a small amount of Mo metal (d=2.22A).

Laser Raman spectra were recorded to confirm the absence of $MoS_2$ (bands at 383 and 409 $cm^{-1}$). The film thickness was measured to about 0.5 $\mu$m, and gave an estimate for the growth rate of 120/min. No preferential growth direction can be observed in the films by SEM. The $PbMo_2S_8$ materials were evenly distributed over the $\alpha$-$Al_2O_3$ grains. Small polygon crystal defects were observed on the film surface. Table 1 gives a summary of the "optimal" reactive sputter deposition parameters.

TABLE 1

Optimal reactive sputter deposition parameters for $PbMO_6S_8$ thin films on supports.

| Experiment Series # | Chamber Pressure (mT) | Ar Flow Rate (sccm) | H$_2$S Flow Rate (sccm) | Pb Current (mA) | Mo Power (W) | Mo Current (A) | Hrs Mo Target Spent |
|---|---|---|---|---|---|---|---|
| 1 | 4 | 8 | 15 | 25 | 120 | 0.449 | >60 |
| 2 | 4 | 8 | 5 | 25 | 120 | 0.148 | 6 (new) |
| 3 | 4 | 8 | 7 | 25 | 120 | 0.171 | 20 |
| 4 | 4 | 8 | 11 | 25–50 | 120 | 0.324 | 35 |

*The deposition time for all series was 30 minutes without substrate heating.

Annealing was necessary in order to obtain crystalline $PbMo_6S_8$ films. A temperature of 750° C. for 3 hrs was sufficient to form crystalline films. The quality of the final $PbMo_6S_8$ films was not affected significantly by an increase in annealing time and temperature, based on XRD and LRS data. Therefore, the annealing conditions were standardized at 800° C. for 4 hrs.

Figure 3:
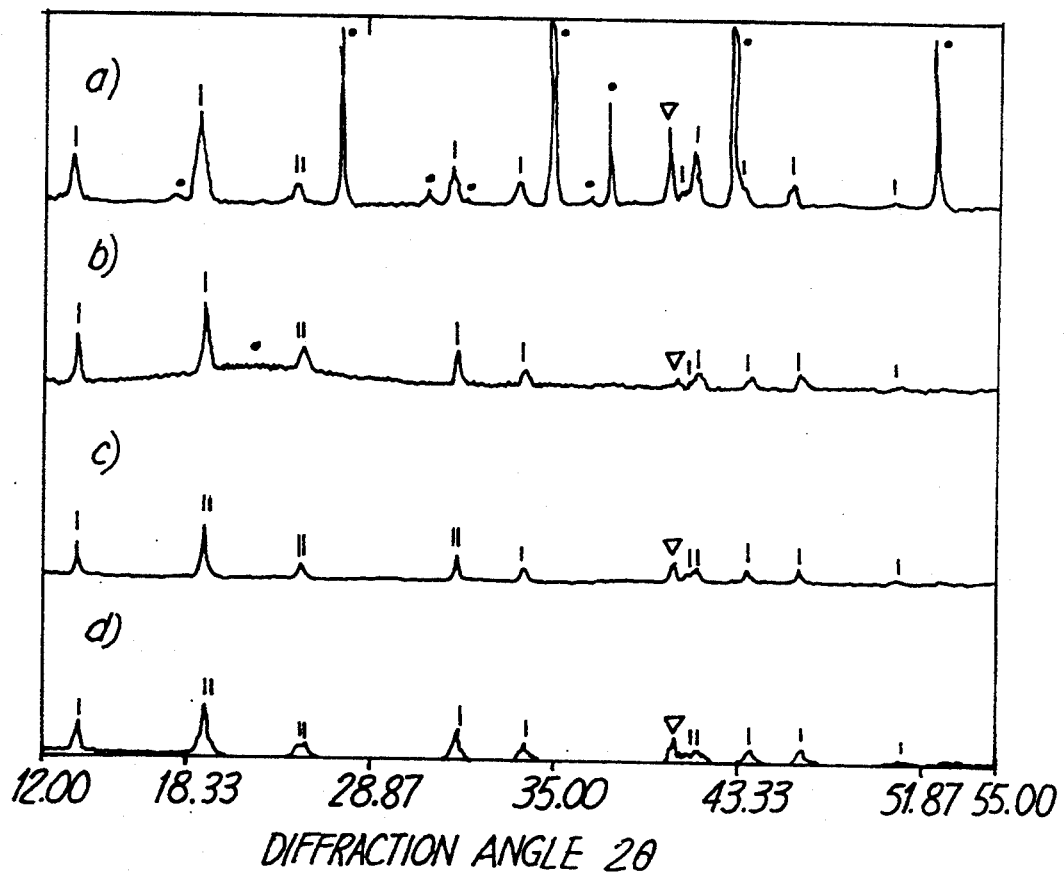
FIG. 3 depicts XRD patterns of $PbMo_6S_8$ thin films supported on a) $\alpha$-$Al_2O_3$, b) quartz, c) sapphire, and d) Mo.

Sapphire, quartz and Mo were also used as substrates. Single phase films of $PbMo_6S_8$ were also successfully produced on all three substrates by the two-step preparation method (FIG. 3). Similar characterization results as $\alpha$-$Al_2O_3$ support films were obtained. XRD patterns show randomly oriented $PbMo_6S_8$ with a little "free" Mo metal. There was no significant change in film orientation due to the use of different substrates. LRS results showed no $MoS_2$.

D. One-Step Process

Single phase $PbMo_6S_8$ thin films were preferably formed by a one-step preparation process. Pb and Mo were reactively sputtered in an Ar—$H_2S$ atmosphere at the conditions given in Part A, above. After deposition, the sputtering chamber was isolated and backfilled (to 1.5 torr) with nitrogen ($N_2$). The deposited films were annealed in situ at 800° C. for 4 hrs using the induction heater.

E. Discussion

There is a minimum Pb deposition rate required for the deposition of lead Chevrel phases. If the Pb deposition rate fell below the minimum required value, randomly oriented $MoS_2$ would form during deposition and would not be further incorporated into lead Chevrel phases. High Pb deposition rates do not affect the quality of the annealed films. It is assumed that excess Pb evaporates during annealing.

Figure 4:
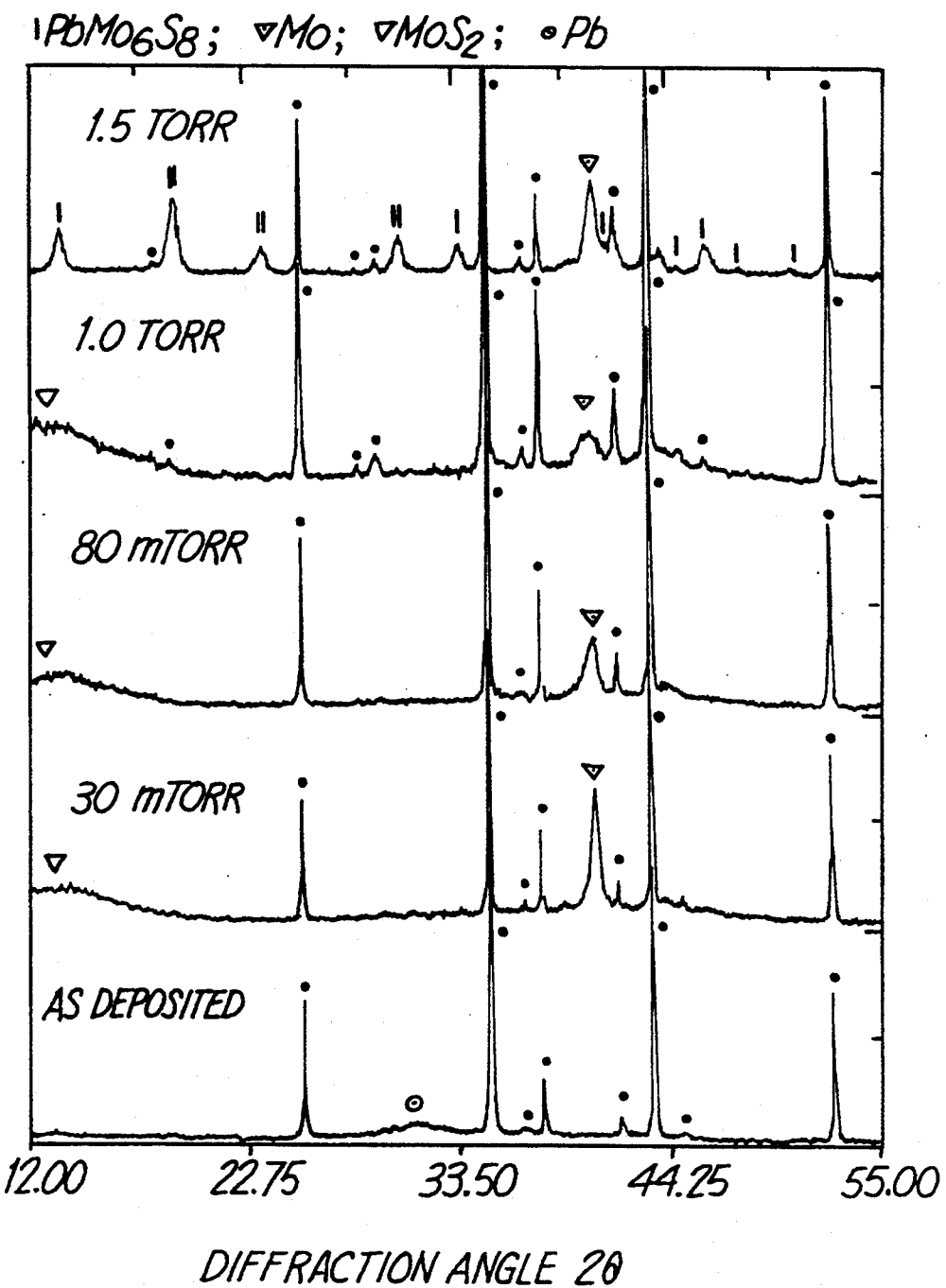
FIG. 4 depicts XRD patterns of in situ annealed films versus annealing chamber back pressures.

The effect of Pb vapor pressure also has to be considered during annealing. The vapor pressure of Pb at Chevrel phase annealing temperature (800° C.) is about 1 torr (Perry's). Therefore, Pb will easily sublimate during annealing at normal vacuum conditions (<$10^{-4}$ torr). By backpressuring the sputtering chamber during annealing, the present process suppresses the sublimation of Pb. The effect of annealing chamber pressure on the resulting films are shown in FIG. 4. At low pressure (30 mtorr-1.0 torr), Mo metal and poorly crystalline $MoS_2$ (d=6.15A) were detected. As the annealing chamber pressure increased, a decrease in Mo metal crystallinity and a slight increase in peak intensity of $MoS_2$ was observed. At the annealing chamber pressure greater than 1.5 torr, XRD patterns of randomly oriented single phase film of $PbMo_6S_8$ along with Mo metal were observed. However, a significant decrease in the d-spacing at the lower 2 region was observed in films containing large amounts of "free" Mo.

Previous attempts to reactive sputter deposit lead Chevrel phase thin film in situ onto heated substrates were not successful due to the volatility of Pb at high temperature. The two-step preparation method described above permits the formation of essentially pure films of $PbMo_6S_8$ on various substrates, including $\alpha$-$Al_2O_3$, sapphire, quartz, Mo and low surface area alumina granulates. However, the $\gamma$-alumina surface is extremely susceptible to water absorption. A high surface area alumina can absorb up to 30 wt-% of water. The surface-absorbed water is detrimental to the formation of Chevrel phase materials during high temperature annealing. Using the two-step preparation process, the exposure of sample to air and moisture is almost unavoidable, especially during sample transport into quartz tubes for annealing.

Significant advantages result from the present one-step preparation of supported lead Chevrel phases, in situ in the sputtering chamber. This in situ preparation process virtually eliminates sample exposure to moisture. The support can be pre-heated to the same annealing temperature (800° C.) in high vacuum to desorb the surface water. The pre-heating also reduces the sintering of the support during the formation of lead Chevrel phase at high temperature.

Any excess Pb in the deposited film does not affect the quality of final annealed film, since it will be sublimated during annealing. The chamber wall was slightly heated during annealing to reduce condensation. Most importantly, by backfilling the chamber with a pressure slightly greater than the vapor pressure of Pb, the evaporation of Pb during annealing was suppressed.

The Chevrel phase formation reaction starts with the formation of a mixture of amorphous molybdenum disulfide and Pb metal. This phenomena was also observed by M. Rabilla-Baudry et al., *J. Alloys and Compounds,* 178, 441 (1990), using soluble sulfide precursors synthesis in preparing Chevrel phases materials. This is the most volatile state of Pb since its vapor pressure at Chevrel phase formation temperature (800° C.) is about 1 torr which is much higher than most vacuum preparation conditions. Therefore, it is important to maintain the Pb content of the deposit during this period. The present method successfully counters the sublimation of Pb by applying a pressure greater than the vapor pressure of Pb during the in situ annealing step.

EXAMPLE 2

HYDRODESULFURIZATION

Thiophene (Alfa, 99%) HDS activity measurements were performed at 400° C. and atmospheric pressure using a continuous-flow microreactor. The fresh catalysts were heated from room temperature to 400° C. in He (19 ml/min, STP); after 1 hr, the flow was replaced with a continuous flow of 2 mol-% thiophene in hydrogen at 22 ml/min, STP. Product separation and analysis were performed by an Antek 310/40 gas chromatography equipped with a flame ionization detector and a 12 ft n-octane/porasil C column; peak intensities were integrated by a Hewlett-Packard 3390A integrator. Conversion of thiophene by the reactor (0.04%) was subtracted from the total conversion. After 10 hr of continuous thiophene reaction, the reactor was purged and cooled in a stream of He and the used catalysts were characterized.

The continuous-flow thiophene HDS reaction results for the lead Chevrel phase supported on $\alpha$-$Al_2O_3$ as prepared by the two-step process, are provided in Tables 2 and 3; conversions for bulk $PbMo_6S_8$ and other model $MoS_2$-based catalysts are also given.

TABLE 2

| | Thiophene HDS conversion at 400° C. | | |
|---|---|---|---|
| Catalyst | Surface areas (m²/g) | Reaction time | Thiophene Conversion (%) |
| $PbMo_6S_8$ on $\alpha$-$Al_2O_3$ | 0.03 | 20 min | 0.691 |
| | | 1 hr | 0.582 |
| | | 10 hr | 0.339 |
| $PbMo_6S_8$ | 1.318 | 20 min | 1.59 |
| | | 10 hr | 1.16 |
| $Co_{0.25}$-Mo—S[a] | 10.83 | 20 min | 1.94 |
| | | 10 hr | 0.77 |
| 1000° C. $MoS_2$[a] | 3.40 | 20 min | 2.22 |
| | | 10 hr | 0.76 |

[a]G.L. Schrader et al., Advances in Hydrotreating Catalysts, 50, 41 (1989).

TABLE 3

| | $C_4$ products for thiophene HDS at 400° C. | | | |
|---|---|---|---|---|
| | Reaction | $C_4$ product distribution | | |
| Catalyst | time | n-butane | 1-butene | trans-2-butene | cis-2-butene |
| $PbMo_6S_8$ on $\alpha$-$Al_2O_3$ | 20 min | a | 38.3 | 35.8 | 25.9 |
| | 1 hr | a | 62.6 | 15.1 | 22.3 |
| | 10 hr | a | 66.3 | 18.5 | 15.2 |
| $PbMo_6S_8$ | 20 min | a | 65.5 | 20.2 | 14.3 |
| | 10 hr | a | 65.6 | 21.8 | 12.6 |
| $Co_{0.25}$-Mo—S | 20 min | 1.3 | 35.9 | 28.0 | 24.8 |
| | 10 hr | 1.5 | 36.4 | 41.1 | 21.0 |
| 1000° C. $MoS_2$ | 20 min | 2.67 | 41.2 | 32.7 | 23.7 |
| | 10 hr | 0.92 | 46.0 | 34.9 | 17.3 |

[a]Below detection limit.

During the first 2 hrs HDS reaction, the thiophene mole-% conversion decreased steadily to about one-half of its original value; during the last 8 hrs, the thiophene conversion stabilized to around 0.35 mol-%. The $C_4$ product distribution was similar to the unsupported lead Chevrel phase after one hr reaction time. This is particularly apparent with respect to the relative distribution of butenes and the absence of n-butane (complete hydrogenation product).

Thus, supported $PbMo_6S_8$ catalysts exhibited thiophene HDS activities comparable or perhaps higher than those observed for the bulk phase or for two other model compounds (Table 2). The $C_4$ product distribution data for the supported lead Chevrel phase catalysts after 1 hr was similar to that for bulk $PbMo_6S_8$ (Table 3): 1-butene with little n-butane was produced.

All publications and patents are herein incorporated by reference to the same extent as if each individual publication or patent was specifically and individually indicated to be incorporated by reference.

It will be apparent to one of ordinary skill in the art that many changes and modifications can be made in the invention without departing from the spirit or scope of the appended claims.

What is claimed is:

1. A method to form a lead Chevrel phase coating of the formula $PbMo_6S_8$ on a substrate by employing the techniques of reactive sputtering comprising the steps of:
   (a) sputtering lead (Pb) and molybdenum (Mo) from discrete
   targets of Pb metal and Mo metal in vacuo in an atmosphere of argon and hydrogen sulfide so as to deposit an amorphous coating comprising Pb, S and Mo on said substrate; and subsequently
   (b) annealing said coating at a pressure at which Pb is not sublimated from the coating; wherein the targets and the substrate are contained within a vacuum chamber during steps (a) and (b), so as to yield a crystalline lead Chevrel phase coating of the formula $PbMo_6S_8$.

2. The method of claim 1 wherein step (a) is carried out at less than 150° C.

3. The method of claim 1 wherein the sputtering is carried out at about 2.5-50 mtorr.

4. The method of claim 3 wherein the sputtering is carried out at about 4-10 mtorr.

5. The method of claim 1 wherein a stream of hydrogen sulfide is introduced into the vacuum chamber at about 5-15 sccm during step (a).

6. The method of claim 1 wherein a stream of argon is introduced into the vacuum chamber at about 7.5-10 sccm during step (a).

7. The method of claim 1 wherein the coating is annealed to about 750°-850° C. in step (b).

8. The method of claim 7 wherein the coating is annealed at about 1-2 torr in step (b).

9. The method of claim 7 wherein the coating is annealed in an atmosphere of an inert gas.

10. The method of claim 1 wherein the substrate is heated to about 750°-850° C. in vacuo prior to step (a).

11. The method of claim 1 wherein the substrate is selected from the group consisting of alumina, zirconia, quartz, molybdenum or stainless steel.

12. The method of claim 11 wherein the substrate is alumina.

* * * * *

UNITED STATES PATENT AND TRADEMARK OFFICE
CERTIFICATE OF CORRECTION

PATENT NO. : 5,421,973
DATED : June 6, 1995
INVENTOR(S) : Kwan F. Koo et al.

It is certified that error appears in the above-indentified patent and that said Letters Patent is hereby corrected as shown below:

Column 1 Line 65 "$HO_xMo_6S_8$," should read --$HO_xMo_6S_{8-y}$-- therefor.

Column 2 Line 40 "1078" should read --107B-- therefor.

Column 3 Line 29 "substrates" should read --substrate-- therefor.

Column 3 Line 39 "$MxMo_6Z_8$" should read --$M_xMo_6Z_8$,-- therefor.

Column 3 Line 64 "$PBMo_6S_8$" should read --$PbMo_6S_8$-- therefor.

Column 5 Line 32 "2 q" should read --2q-- therefor.

Column 5 Line 48 "key" should read --keV-- therefor.

Column 5 Line 67 "($MoS_2$, d=6.12A)" should read --($MoS_2$, d=6.12Å)-- therefor.

Column 5 Line 68 "(d=2.22A)" should read --(d=2.22Å)-- therefor.

Column 6 Line 6 "$PbMo_2S_8$" should read --$PbMo_6S_8$-- therefor.

UNITED STATES PATENT AND TRADEMARK OFFICE
CERTIFICATE OF CORRECTION

PATENT NO. : 5,421,973
DATED : June 6, 1995
INVENTOR(S) : Kwan F. Koo et al.

It is certified that error appears in the above-indentified patent and that said Letters Patent is hereby corrected as shown below:

Column 6 Line 68 "(d=6.15A)" should read --(d=6.15Å) therefor.

Signed and Sealed this

Third Day of September, 1996

Attest:

BRUCE LEHMAN

*Attesting Officer*     *Commissioner of Patents and Trademarks*